(12) United States Patent
Shimizu

(10) Patent No.: US 10,215,780 B2
(45) Date of Patent: Feb. 26, 2019

(54) CURRENT SENSOR

(71) Applicant: Murata Manufacturing Co., Ltd., Nagaokakyo-shi, Kyoto-fu (JP)

(72) Inventor: Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 37 days.

(21) Appl. No.: 15/709,627

(22) Filed: Sep. 20, 2017

(65) Prior Publication Data

US 2018/0003742 A1 Jan. 4, 2018

Related U.S. Application Data

(63) Continuation of application No. PCT/JP2015/068626, filed on Jun. 29, 2015.

(30) Foreign Application Priority Data

Jun. 4, 2015 (JP) ................................. 2015-113885

(51) Int. Cl.
*G01R 15/20* (2006.01)
(52) U.S. Cl.
CPC ........... *G01R 15/20* (2013.01); *G01R 15/207* (2013.01)
(58) Field of Classification Search
None
See application file for complete search history.

(56) References Cited

U.S. PATENT DOCUMENTS 6,512,359 B1 1/2003 Tamai et al.
7,538,540 B2 * 5/2009 Tsukamoto ............ G01R 15/20
324/117 R
(Continued)

FOREIGN PATENT DOCUMENTS

JP 2001-074782 A 3/2001
JP 2007-078418 A 3/2007
(Continued)

OTHER PUBLICATIONS

Official Communication issued in corresponding Japanese Patent Application No. 2016-100511, dated May 22, 2018.
(Continued)

*Primary Examiner* — Vinh P Nguyen
(74) *Attorney, Agent, or Firm* — Keating & Bennett, LLP

(57) ABSTRACT

A current sensor includes a primary conductor through which a current to be measured flows and a first magnetic sensor and a second magnetic sensor that each detects an intensity of a magnetic field generated by the current flowing through the primary conductor. The current is diverted into two flow channels and flows through the primary conductor in a length direction of the primary conductor. The primary conductor includes an arch portion that extends in the length direction while bending to project in one thickness direction of the primary conductor, and defines one of the two flow channels. The first magnetic sensor is disposed on an inner side of the arch portion and is located on a side of an undersurface of the primary conductor. The second magnetic sensor is located on a side of a surface of a portion of the primary conductor which defines the other one of the two flow channels.

18 Claims, 7 Drawing Sheets

(56) References Cited

U.S. PATENT DOCUMENTS

| | | | | |
|---|---|---|---|---|
| 7,626,376 | B2* | 12/2009 | Muraki | B82Y 25/00 |
| | | | | 324/117 H |
| 8,330,453 | B2* | 12/2012 | Hotz | G01R 15/207 |
| | | | | 324/117 H |
| 2013/0257469 | A1 | 10/2013 | Arima | |
| 2014/0097826 | A1* | 4/2014 | Hebiguchi | G01R 15/207 |
| | | | | 324/117 R |
| 2014/0375305 | A1 | 12/2014 | Kawase | |

FOREIGN PATENT DOCUMENTS

| | | |
|---|---|---|
| JP | 2008-039734 A | 2/2008 |
| JP | 2008-111748 A | 5/2008 |
| JP | 2008-216230 A | 9/2008 |
| JP | 2013-142604 A | 7/2013 |
| JP | 2013-228353 A | 11/2013 |
| WO | 2012/050048 A1 | 4/2012 |
| WO | 2013/005459 A1 | 1/2013 |
| WO | 2013/136751 A1 | 9/2013 |
| WO | 2014/123007 A1 | 8/2014 |

OTHER PUBLICATIONS

Official Communication issued in International Patent Application No. PCT/JP2015/068626, dated Aug. 18, 2015.

* cited by examiner

CURRENT SENSOR

CROSS REFERENCE TO RELATED APPLICATIONS

This application claims the benefit of priority to Japanese Patent Application No. 2015-113885 filed on Jun. 4, 2015 and is a Continuation Application of PCT Application No. PCT/JP2015/068626 filed on Jun. 29, 2015. The entire contents of each application are hereby incorporated herein by reference.

BACKGROUND OF THE INVENTION

1. Field of the Invention

The present invention relates to a current sensor for detecting a value of a current to be measured by measuring a magnetic field generated by the current.

2. Description of the Related Art

Japanese Unexamined Patent Application Publication Nos. 2008-111748, 2008-216230, and 2007-78418 disclose configurations of respective current sensors.

The current sensor disclosed in Japanese Unexamined Patent Application Publication No. 2008-111748 includes a magnetic detection element placed between examined portions of a bus bar, an insulating molding portion engaged between the examined portions while molding the magnetic detection element, and a shielding portion that is made of a magnetic material and is integrally formed on both side surfaces of the insulating molding portion on both sides of the bus bar so as not to be in contact with the bus bar.

The current sensor disclosed in Japanese Unexamined Patent Application Publication No. 2008-216230 includes four magnetoresistive elements disposed on a mounting substrate, a current detection device in which a first half bridge circuit is provided in one of regions divided by a center line of the mounting substrate and a second half bridge circuit is provided on the other one of the regions, and a U-shaped primary conductor including at least one slit portion. The current detection device is disposed in at least one of the slit portion, the top portion of the U-shaped primary conductor, and the bottom portion of the U-shaped primary conductor.

In the current sensor disclosed in Japanese Unexamined Patent Application Publication No. 2007-78418, an integrated chip is disposed between two parallel lines that are bus bars. The integrated chip is disposed in a stepped space between the two lines such that one of the two lines is disposed on a front side and the other one of the two lines is disposed on a back side. Vertical Hall elements mounted on the integrated chip detect respective magnetic vectors in opposite directions which are generated by currents flowing through the two lines (currents in the same direction in both lines).

In the current sensor disclosed in Japanese Unexamined Patent Application Publication No. 2008-111748, a configuration including a plurality of magnetic detection elements is not considered or disclosed.

The sensitivity of the current sensor disclosed in Japanese Unexamined Patent Application Publication No. 2008-216230 is low, because a magnetic flux density detected by a magnetic detection element is reduced to broaden the measurement range of the current sensor.

In the current sensor disclosed in Japanese Unexamined Patent Application Publication No. 2007-78418, an integrated chip on which a magnetic detection element is mounted is disposed in a stepped space between two parallel lines. Around a center between the two lines, magnetic fields generated around the respective lines cancel each other. In a case where the magnetic detection element is disposed around the center between the two lines, a magnetic flux density detected by the magnetic detection element is reduced and the sensitivity of the current sensor is reduced.

SUMMARY OF THE INVENTION

Preferred embodiments of the present invention provide high-sensitivity current sensors that are capable of reducing the influence of an external magnetic field.

A current sensor according to a preferred embodiment of the present invention includes a primary conductor through which a current to be measured flows and a first magnetic sensor and a second magnetic sensor each detecting an intensity of a magnetic field generated by the current flowing through the primary conductor. The current is diverted into two flow channels and flows through the primary conductor in a length direction of the primary conductor. The primary conductor includes an arch portion that extends in the length direction while bending to project in one thickness direction of the primary conductor, and defines one of the two flow channels. The first magnetic sensor and the second magnetic sensor are arranged in a width direction of the primary conductor. The first magnetic sensor is provided on an inner side of the arch portion and is located on a side of an undersurface of the primary conductor. The second magnetic sensor is located on a side of a surface of a portion of the primary conductor which defines the other one of the two flow channels. Each of the first magnetic sensor and the second magnetic sensor detects a magnetic field in the width direction.

In a preferred embodiment of the present invention, the current sensor further includes a calculator that calculates a value of the current by performing computations with a detection value of the first magnetic sensor and a detection value of the second magnetic sensor. Regarding an intensity of a magnetic field generated by the current flowing through the primary conductor, a detection value of the first magnetic sensor and a detection value of the second magnetic sensor are opposite in phase. The calculator is preferably a subtractor or a differential amplifier, for example.

In a preferred embodiment of the present invention, a current sensor further includes a calculator that calculates a value of the current by performing computations with a detection value of the first magnetic sensor and a detection value of the second magnetic sensor. Regarding an intensity of a magnetic field generated by the current flowing through the primary conductor, a detection value of the first magnetic sensor and a detection value of the second magnetic sensor are in phase. The calculator is preferably an adder or a summing amplifier, for example.

In a preferred embodiment of the present invention, a primary conductor further includes a reverse arch portion that extends in the length direction while bending to project in the other thickness direction and defines the other flow channel. The reverse arch portion and the arch portion are arranged in the width direction. The second magnetic sensor is provided on an inner side of the reverse arch portion and is located on a side of the surface of the primary conductor.

In a preferred embodiment of the present invention, the arch portion and the reverse arch portion preferably have the same or substantially the same shape.

In a preferred embodiment of the present invention, a slit extending in the length direction is provided in the primary conductor. The slit is adjacent to the arch portion in the width direction and is located between the first magnetic sensor and the second magnetic sensor when viewed in the thickness direction.

In a preferred embodiment of the present invention, the slit is located between the first magnetic sensor and the second magnetic sensor in the width direction when viewed in the thickness direction.

In a preferred embodiment of the present invention, the slit is preferably located at a center or approximate center of the primary conductor in the width direction.

In a preferred embodiment of the present invention, the first magnetic sensor and the second magnetic sensor are preferably mounted on a single substrate.

In a preferred embodiment of the present invention, each of the first magnetic sensor and the second magnetic sensor has a detection axis in the width direction and a sensitivity change axis perpendicular or substantially perpendicular to the detection axis. Output sensitivity of each of the first magnetic sensor and the second magnetic sensor changes when a magnetic field in a direction along the sensitivity change axis is applied thereto. Each of the first magnetic sensor and the second magnetic sensor is positioned such that the sensitivity change axis is along the length direction.

In a preferred embodiment of the present invention, the current sensor further includes a cabinet that accommodates the first magnetic sensor and the second magnetic sensor. The cabinet is in contact with at least a portion of an inner surface of the arch portion.

In a preferred embodiment of the present invention, the arch portion includes an extension portion extending in the length direction. The cabinet is in contact with at least a portion of an undersurface of the extension portion.

In a preferred embodiment of the present invention, the current sensor further includes a cabinet that accommodates the first magnetic sensor and the second magnetic sensor. The cabinet is in contact with at least a portion of an inner surface of the arch portion and at least a portion of an inner surface of the reverse arch portion.

In a preferred embodiment of the present invention, each of the arch portion and the reverse arch portion includes an extension portion extending in the length direction. The cabinet is in contact with at least a portion of an undersurface of the extension portion of the arch portion and at least a portion of a surface of the extension portion of the reverse arch portion.

According to various preferred embodiments of the present invention, it is possible to reduce the influence of an external magnetic field while increasing the sensitivity of current sensors.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
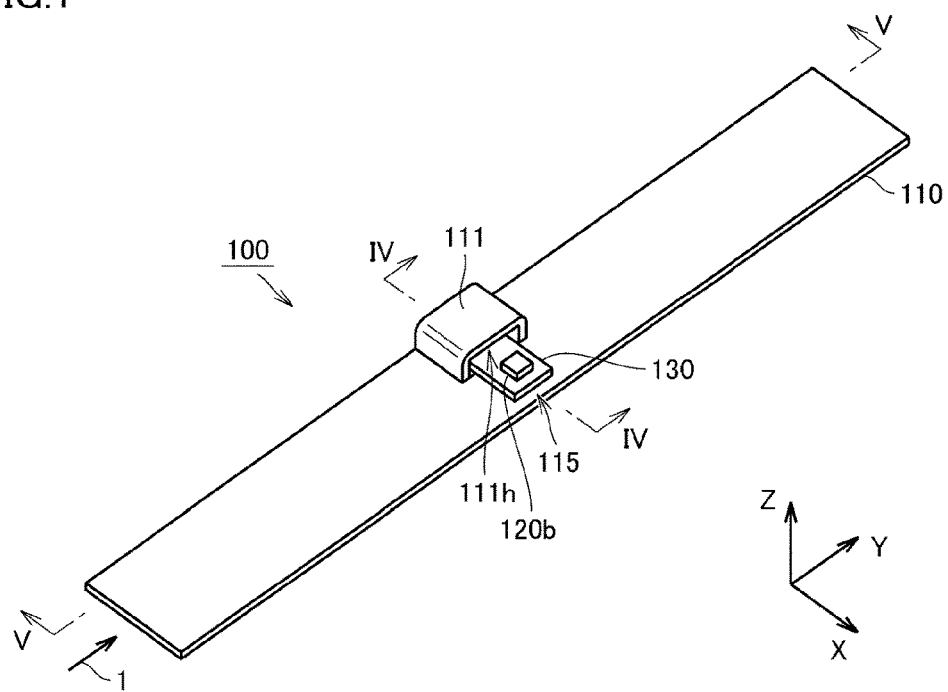
FIG. 1 is an external perspective view of a current sensor according to a first preferred embodiment of the present invention.

A current sensor according to each preferred embodiment of the present invention will be described below with reference to the accompanying drawings. In the drawings, the same reference numerals are used to represent the same components or the same portions so as to avoid repeated explanation.

First Preferred Embodiment

Figure 2:
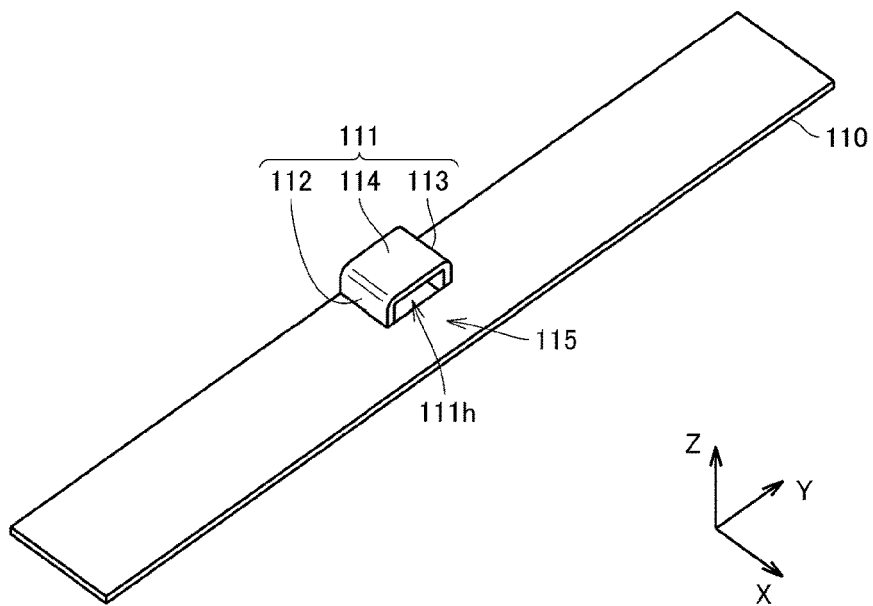
FIG. 2 is an external perspective view of a primary conductor included in a current sensor according to the first preferred embodiment of the present invention.
Figure 3:
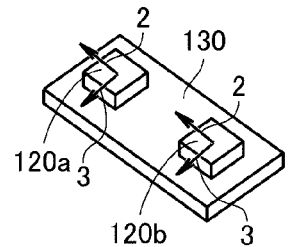
FIG. 3 is an external perspective view of a first magnetic sensor and a second magnetic sensor included in a current sensor according to the first preferred embodiment of the present invention.
Figure 4:
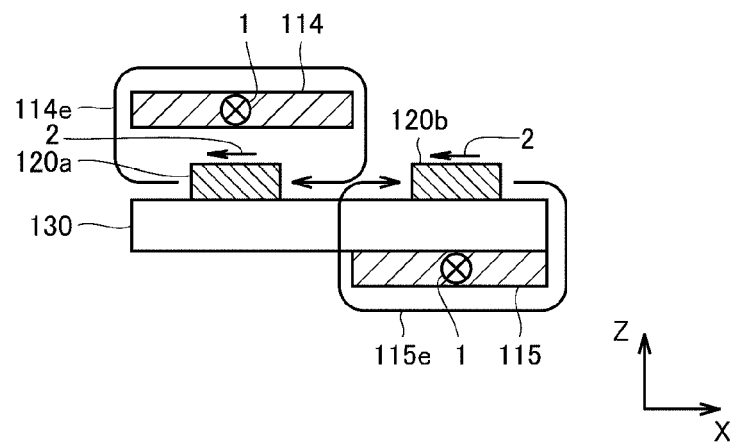
FIG. 4 is a cross-sectional view of a current sensor according to the first preferred embodiment of the present invention as viewed from the direction of arrows of line IV-IV in FIG. 1.
Figure 5:
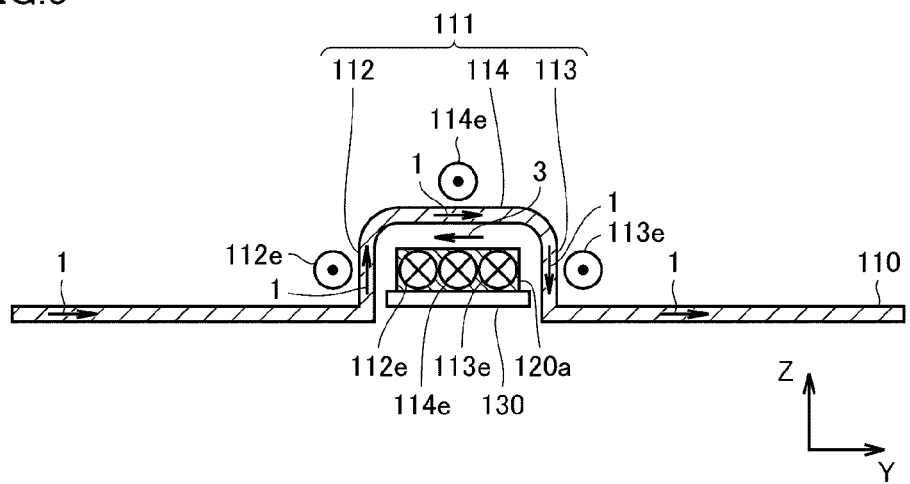
FIG. 5 is a cross-sectional view of a current sensor according to the first preferred embodiment of the present invention as viewed from the direction of arrows of line V-V in FIG. 1.
Figure 6:
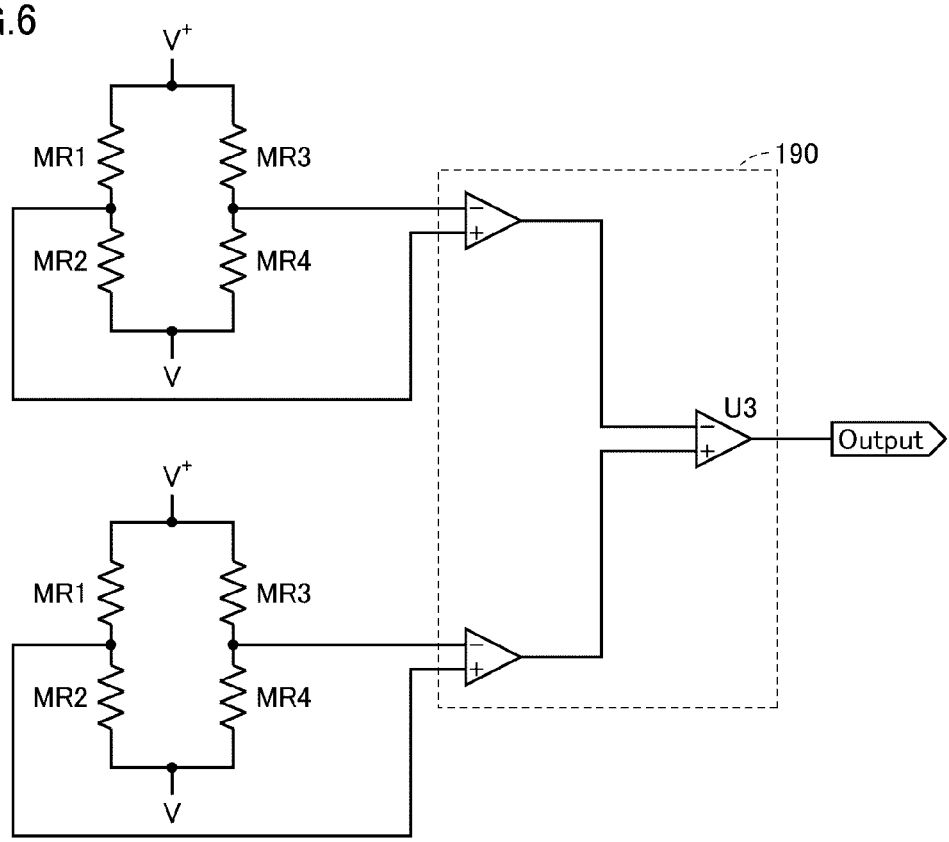
FIG. 6 is a circuit diagram illustrating the circuit configuration of a current sensor according to the first preferred embodiment of the present invention.

FIG. 1 is an external perspective view of a current sensor according to the first preferred embodiment of the present invention. FIG. 2 is an external perspective view of a primary conductor included in a current sensor according to the first preferred embodiment of the present invention. FIG. 3 is an external perspective view of a first magnetic sensor and a second magnetic sensor included in a current sensor according to the first preferred embodiment of the present invention. FIG. 4 is a cross-sectional view of a current sensor according to the first preferred embodiment of the present invention as viewed from the direction of arrows of line IV-IV in FIG. 1. FIG. 5 is a cross-sectional view of a current sensor according to the first preferred embodiment of the present invention as viewed from the direction of arrows of line V-V in FIG. 1. FIG. 6 is a circuit diagram illustrating the circuit configuration of a current sensor according to the first preferred embodiment of the present invention. In FIGS. 1, 2, 4, and 5, the width direction of a primary conductor 110 to be described below is an X-axis direction, the length direction of the primary conductor 110 is a Y-axis direction, and the thickness direction of the primary conductor 110 is a Z-axis direction.

As illustrated in FIGS. 1 to 6, a current sensor 100 according to the first preferred embodiment of the present invention includes the primary conductor 110 through which a current to be measured flows and first and second magnetic sensors 120a and 120b that detect the intensity of a magnetic field generated by a current to be measured flowing through the primary conductor 110. As will be described below, a current to be measured is diverted into two flow channels and flows through the primary conductor 110 in the length direction (Y-axis direction) of the primary conductor 110 as indicated by an arrow 1.

The primary conductor 110 includes an arch portion 111 that extends in the length direction (Y-axis direction) while bending to project in one thickness direction (Z-axis direction) of the primary conductor 110 and defines one of two flow channels. A flat portion 115 adjacent to the arch portion 111 in the width direction (X-axis direction) of the primary conductor 110 defines the other one of the two flow channels. An opening portion 111h to the inner side of the arch portion 111 is provided between the arch portion 111 and the flat portion 115.

As illustrated in FIG. 2, in this preferred embodiment, the arch portion 111 includes a first protrusion portion 112 and a second protrusion portion 113 that protrude perpendicular or substantially perpendicular from the main surface of the primary conductor 110 and are spaced apart from each other and an extension portion 114 that extends in the length direction (Y-axis direction) of the primary conductor 110 and connects the first protrusion portion 112 and the second protrusion portion 113. The arch portion 111 does not necessarily need to have this shape and may have, for example, a C shape or a semicircular shape when viewed in the width direction (X-axis direction) of the primary conductor 110.

In this preferred embodiment, the primary conductor 110 is preferably made of copper, for example. However, a material for the primary conductor 110 may be metal such as silver, aluminum, or iron or an alloy of these metals, for example.

The primary conductor 110 may preferably be subjected to surface treatment. For example, at least one plating layer made of metal such as nickel, tin, silver, or copper or an alloy of these metals may be provided on the surface of the primary conductor 110.

The primary conductor 110 is preferably formed by casting in this preferred embodiment, but may be formed by machining or press working, for example.

The first magnetic sensor 120a and the second magnetic sensor 120b are arranged in the width direction (X-axis direction) of the primary conductor 110. As illustrated in FIG. 3, the first magnetic sensor 120a and the second magnetic sensor 120b are mounted on a single substrate 130 in this preferred embodiment. The first magnetic sensor 120a and the second magnetic sensor 120b are mounted on the substrate 130 along with electronic components including an amplifier and a passive element. In FIGS. 1, 3, 4, and 5, an amplifier and a passive element are not illustrated. An amplifier and a passive element may preferably be mounted on a different substrate from the substrate 130 on which the first magnetic sensor 120a and the second magnetic sensor 120b are mounted.

The substrate 130 is preferably a printed wiring board including a base made of glass epoxy or alumina, for example, and a wiring line formed by patterning a metal foil made of, for example, copper on the surface of the base.

A portion of the substrate 130 on which the first magnetic sensor 120a and the second magnetic sensor 120b are mounted is inserted into the opening portion 111h. The remaining portion of the substrate 130 is disposed on the flat portion 115. The first magnetic sensor 120a is therefore located on the inner side of the arch portion 111 and is located on the side of the undersurface of the extension portion 114. The second magnetic sensor 120b is located on the side of the surface of the flat portion 115.

The substrate 130 is arranged such that the mounting surface of the substrate 130 and the surface of the flat portion 115 are parallel or substantially parallel to each other in this preferred embodiment, but may be arranged such that the mounting surface of the substrate 130 and the surface of the flat portion 115 are disposed vertically.

Each of the first magnetic sensor 120a and the second magnetic sensor 120b detects a magnetic field in the width direction (X-axis direction) of the primary conductor 110. Specifically, each of the first magnetic sensor 120a and the second magnetic sensor 120b has a detection axis 2 in the width direction (X-axis direction) of the primary conductor 110.

Each of the first magnetic sensor 120a and the second magnetic sensor 120b has odd function input/output characteristics in which a positive value is output at the time of detection of a magnetic field in one direction of the detection axis 2 and a negative value is output at the time of detection of a magnetic field in a direction opposite to one direction of the detection axis 2.

As illustrated in FIG. 6, in the current sensor 100 according to this preferred embodiment, each of the first magnetic sensor 120a and the second magnetic sensor 120b preferably includes a Wheatstone bridge circuit including four anisotropic magnetoresistive (AMR) elements, for example. Each of the first magnetic sensor 120a and the second magnetic sensor 120b may include magnetoresistive elements, such as giant magnetoresistive (GMR) elements, tunnel magnetoresistive (TMR) elements, ballistic magnetoresistive (BMR) elements, and colossal magnetoresistive (CMR) elements, for example, instead of AMR elements.

Each of the first magnetic sensor 120a and the second magnetic sensor 120b may preferably include a half bridge circuit including two magnetoresistive elements. As each of the first magnetic sensor 120a and the second magnetic sensor 120b, a magnetic sensor including a Hall element, a magnetic sensor including a magneto-impedance (MI) element utilizing a magneto-impedance effect, or a flux-gate magnetic sensor, for example, may preferably be used. Magnetic elements, such as a magnetoresistive element and a Hall element, may be covered with a resin package or be subjected to silicone resin potting or epoxy resin potting.

In a case where there are a plurality of magnetic elements, they may preferably be covered with a single package or respective packages. Alternatively, a plurality of magnetic elements and an electronic component may be integrally covered with a single package.

In this preferred embodiment, an AMR element has odd function input/output characteristics by including a barber-pole electrode. Specifically, a magnetoresistive element included in each of the first magnetic sensor 120a and the second magnetic sensor 120b includes a barber-pole electrode, so that the magnetoresistive element is biased to allow a current to flow in a direction tilted at a predetermined angle relative to the magnetization direction of a magnetoresistive film in the magnetoresistive element.

The magnetization direction of a magnetoresistive film is determined by a bias magnetic field that is applied to an AMR element because of the shape anisotropy of the magnetoresistive film. A method of applying a bias magnetic field to an AMR element is not limited to a method using the shape anisotropy of a magnetoresistive film, and may be a method of disposing a permanent magnet near a magnetoresistive film constituting an AMR element or a method of performing exchange coupling at a magnetoresistive film constituting an AMR element.

The magnetization direction of a magnetoresistive film in a magnetoresistive element in the first magnetic sensor 120a is preferably the same or substantially the same as the magnetization direction of a magnetoresistive film in a magnetoresistive element in the second magnetic sensor 120b. This suppresses or prevents the reduction in output accuracy which is caused under the influence of an external magnetic field.

As illustrated in FIG. 3, each of the first magnetic sensor 120a and the second magnetic sensor 120b preferably has a sensitivity change axis 3 perpendicular or substantially perpendicular to the detection axis 2. As illustrated in FIGS. 3 and 5, each of the first magnetic sensor 120a and the second magnetic sensor 120b is arranged such that the sensitivity change axis 3 is along the length direction (Y-axis direction) of the primary conductor 110. That is, the sensitivity change axis 3 is oriented toward the length direction (Y-axis direction) of the primary conductor 110.

The output sensitivity of each of the first magnetic sensor 120a and the second magnetic sensor 120b changes when a magnetic field oriented in a direction along the sensitivity change axis 3 is applied thereto. Specifically, the output sensitivity of each of the first magnetic sensor 120a and the second magnetic sensor 120b is high when a magnetic field oriented in a direction opposite to a bias magnetic field application direction is applied thereto in a direction along the sensitivity change axis 3 and is low when a magnetic field oriented in the same direction as the bias magnetic field application direction in the direction along the sensitivity change axis 3. The output of each of the first magnetic sensor 120a and the second magnetic sensor 120b is 0 when only a magnetic field oriented in the direction along the sensitivity change axis 3 is applied thereto.

As illustrated in FIG. 6, the current sensor 100 further includes a calculator 190 that calculates the value of a current to be measured flowing through the primary conductor 110 by performing computations with the detection values of the first magnetic sensor 120a and the second magnetic sensor 120b. The calculator 190 is preferably a differential amplifier in this preferred embodiment, but may be a subtractor.

As illustrated in FIG. 4, a current to be measured is diverted into two flow channels, a flow channel passing through the arch portion 111 and a flow channel passing through the flat portion 115, in the primary conductor 110. In the primary conductor 110, the flows of a current through the two flow channels generate magnetic fields surrounding the respective flow channels in accordance with the corkscrew rule.

As illustrated in FIGS. 4 and 5, since the first magnetic sensor 120a is provided on the inner side of the arch portion 111, a magnetic field 112e surrounding the first protrusion portion 112, a magnetic field 113e surrounding the second protrusion portion 113, and a magnetic field 114e surrounding the extension portion 114 are applied to the first magnetic sensor 120a. Since the intensity of a magnetic field applied to a magnetoresistive element in the first magnetic sensor 120a is therefore increased, the sensitivity of the first magnetic sensor 120a to a current to be measured flowing through the primary conductor 110 becomes high. A magnetic field 115e surrounding the flat portion 115 is applied to the second magnetic sensor 120b.

At a position on a side of the undersurface of the extension portion 114 and a position on a side of the surface of the flat portion 115, the directions of magnetic fluxes are opposite to each other in the X-axis direction. That is, since the direction of a magnetic flux applied to the first magnetic sensor 120a and the direction of a magnetic flux applied to the second magnetic sensor 120b are opposite to each other, the intensity of a magnetic field generated by a current to be measured flowing through the primary conductor 110 has opposite phases when the first magnetic sensor 120a detects the intensity and the second magnetic sensor 120b detects the intensity. In a case where the intensity of a magnetic field detected by the first magnetic sensor 120a has a positive value, the intensity of a magnetic field detected by the second magnetic sensor 120b has a negative value.

The calculator 190 performs computations with the detection value of the first magnetic sensor 120a and the detection value of the second magnetic sensor 120b. Specifically, the calculator 190 subtracts the detection value of the second magnetic sensor 120b from the detection value of the first magnetic sensor 120a. On the basis of a result of this computation, the value of a current to be measured flowing through the primary conductor 110 is calculated.

In the current sensor 100 according to this preferred embodiment, since a portion of the substrate 130 on which the first magnetic sensor 120a and the second magnetic sensor 120b are mounted is inserted into the opening portion 111h, an external magnetic field source cannot be physically located between the first magnetic sensor 120a and the second magnetic sensor 120b.

The orientation of a magnetic field component in the direction of a detection axis which is included in a magnetic field applied from an external magnetic field source to the first magnetic sensor 120a and the orientation of a magnetic field component in the direction of a detection axis which is included in a magnetic field applied from an external magnetic field source to the first magnetic sensor 120b are therefore the same. In a case where the intensity of an external magnetic field detected by the first magnetic sensor 120a has a positive value, the intensity of an external magnetic field detected by the second magnetic sensor 120b also has a positive value.

After the calculator 190 has subtracted the detection value of the second magnetic sensor 120b from the detection value of the first magnetic sensor 120a, a magnetic field applied from an external magnetic field source is barely detected. That is, the influence of the external magnetic field is reduced.

In a modification of this preferred embodiment, the orientations of the detection axes of the first magnetic sensor 120a and the second magnetic sensor 120b, in which detection values are positive, may preferably be (180 degrees) opposite to each other. In this case, when the intensity of an external magnetic field detected by the first magnetic sensor 120a has a positive value, the intensity of an external magnetic field detected by the second magnetic sensor 120b also has a negative value.

In contrast, regarding the intensity of a magnetic field generated by a current to be measured flowing through the primary conductor 110, the detection value of the first magnetic sensor 120a and the detection value of the second magnetic sensor 120b are in phase.

In this modification, the calculator 190 is not a differential amplifier, but instead, is preferably an adder or a summing amplifier, for example. An adder or a summing amplifier adds the intensity of an external magnetic field detected by the first magnetic sensor 120a and the intensity of an external magnetic field detected by the second magnetic sensor 120b to perform subtraction with the absolute value of the detection value of the first magnetic sensor 120a and the absolute value of the detection value of the second magnetic sensor 120b. As a result, a magnetic field applied from an external magnetic field source is barely detected. That is, the influence of an external magnetic field is reduced.

On the other hand, regarding the intensity of a magnetic field generated by a current flowing through the primary conductor 110, an adder or a summing amplifier adds the detection value of the first magnetic sensor 120a and the detection value of the second magnetic sensor 120b to calculate the value of a current to be measured flowing through the primary conductor 110.

Thus, instead of a differential amplifier, an adder or a summing amplifier may preferably be used as a calculator. In this case, the input/output characteristics of the first magnetic sensor 120a and the second magnetic sensor 120b have opposite polarities.

As described above, the increase in the sensitivity of the first magnetic sensor 120a to a current to be measured flowing through the primary conductor 110 is able to increase the sensitivity of the current sensor 100 and reduce the influence of an external magnetic field.

In the current sensor 100, a portion of the substrate 130 on which the first magnetic sensor 120a and the second magnetic sensor 120b are mounted is inserted into the opening portion 111h and the remaining portion of the substrate 130 is mounted on the flat portion 115. Accordingly, the reduction in profile and size of the current sensor 100 and the integration of the current sensor 100 are achieved.

The current sensor 100 according to this preferred embodiment preferably has a configuration in which the substrate 130 on which the first magnetic sensor 120a and the second magnetic sensor 120b are mounted is installed on the primary conductor 110. The assembly of the current sensor 100 is therefore able to be easily performed. In addition, as compared to a case where two primary conductors are used, a reduced number of components and a reduced cost are realized.

Second Preferred Embodiment

A current sensor according to the second preferred embodiment of the present invention will be described. A current sensor 200 according to the second preferred embodiment differs from the current sensor 100 according to the first preferred embodiment only in that a slit is provided in a primary conductor. Since the remaining configuration of the current sensor 200 is the same or substantially the same as that of the current sensor 100, the same reference numerals are used to denote the same portions and the description thereof will be omitted.

Figure 7:
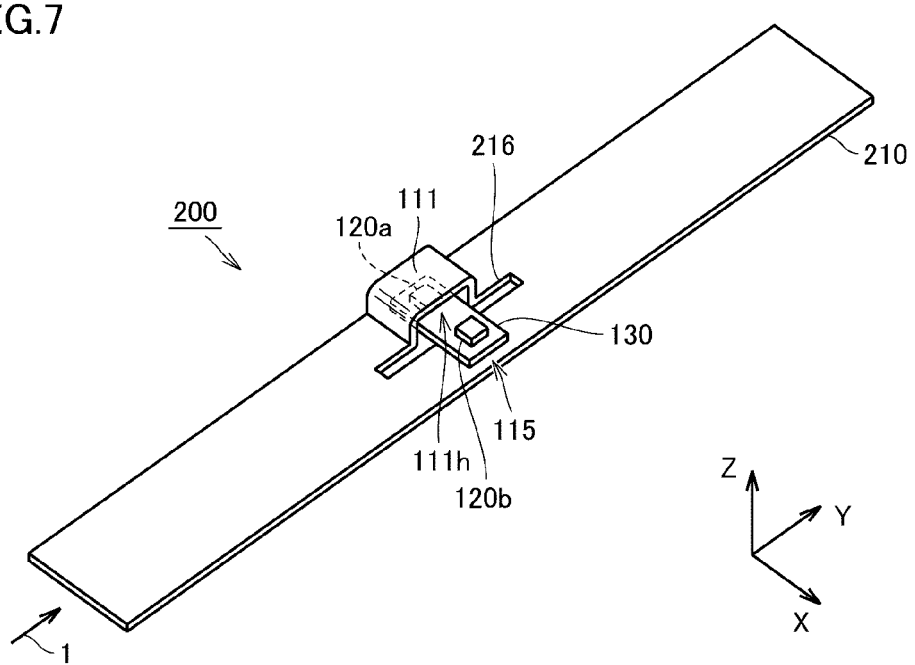
FIG. 7 is an external perspective view of a current sensor according to a second preferred embodiment of the present invention.
Figure 8:
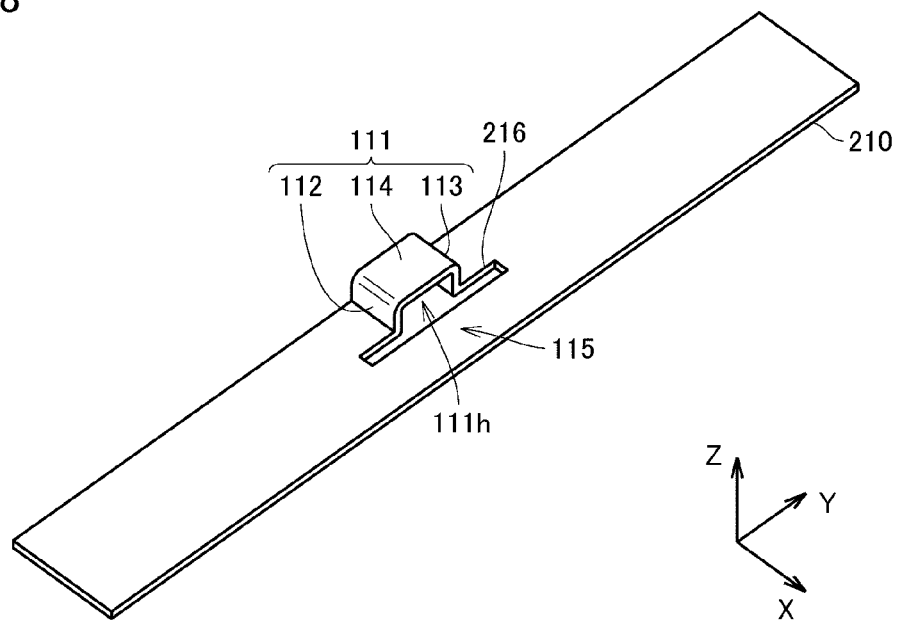
FIG. 8 is an external perspective view of a primary conductor included in a current sensor according to the second preferred embodiment of the present invention.

FIG. 7 is an external perspective view of a current sensor according to the second preferred embodiment of the present invention. FIG. 8 is an external perspective view of a primary conductor included in a current sensor according to the second preferred embodiment of the present invention.

As illustrated in FIGS. 7 and 8, the current sensor 200 according to the second preferred embodiment of the present invention includes a primary conductor 210 through which a current to be measured flows and the first and second magnetic sensors 120a and 120b that detect the intensity of a magnetic field generated by a current to be measured flowing through the primary conductor 210.

In the current sensor 200 according to this preferred embodiment, a slit 216 extending in the length direction (Y-axis direction) of the primary conductor 210 is provided in the primary conductor 210. The slit 216 is adjacent to the arch portion 111 in the width direction (X-axis direction) of the primary conductor 210 and is located between the first magnetic sensor 120a and the second magnetic sensor 120b when viewed in the thickness direction (Z-axis direction) of the primary conductor 210. That is, the slit 216 is provided between the arch portion 111 and the flat portion 115. The slit 216 provides a gap between the arch portion 111 and the flat portion 115.

The slit 216 is preferably in contact with the entirety of the arch portion 111 in the length direction (Y-axis direction) of the primary conductor 210 in this preferred embodiment, but may be in contact with only a portion of the arch portion 111. The slit 216 preferably has a rectangular or substantially rectangular shape when viewed in the thickness direction (Z-axis direction) of the primary conductor 210, but may have, for example, an elliptical shape.

A result of a simulation analysis of the influence of a gap between the extension portion 114 and the flat portion 115 in the X-axis direction on the relationship between the position of a magnetic sensor and a magnetic flux density will be described.

Figure 9:
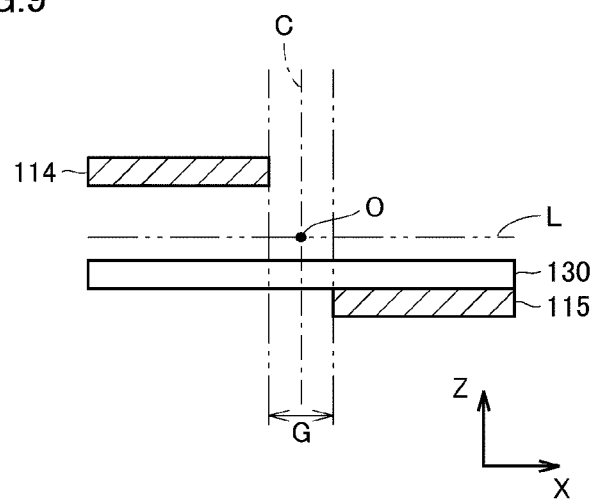
FIG. 9 is a diagram of an analysis model with which a simulation has been performed.
Figure 10:
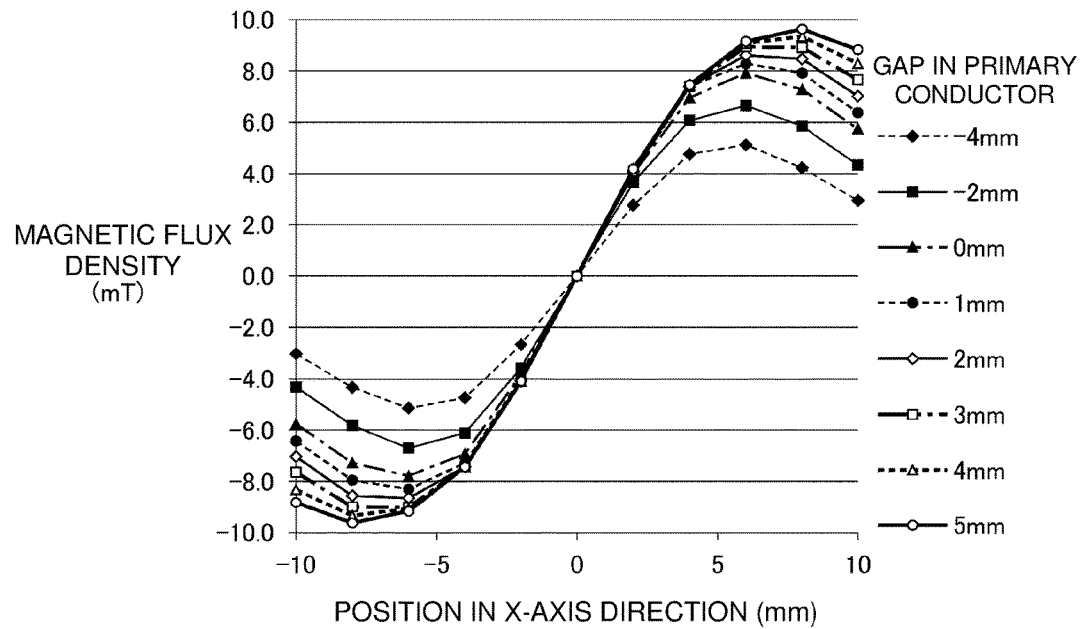
FIG. 10 is a graph indicating a result of a simulation analysis.

FIG. 9 is a diagram of an analysis model with which a simulation has been performed. FIG. 10 is a graph indicating a result of a simulation analysis. In FIG. 10, a vertical axis represents a magnetic flux (mT) in the X-axis direction and a horizontal axis represents a position (mm) in the X-axis direction.

As illustrated in FIG. 9, in the simulation analysis, only the extension portion 114 and the flat portion 115 are taken into consideration as a primary conductor. A gap between the extension portion 114 and the flat portion 115 in the X-axis direction is represented by G. In a case where the gap G has a positive value, the gap G represents the dimension of a gap between the extension portion 114 and the flat portion 115. In a case where the gap G has a negative value, the gap G represents the dimension of a length of an overlapping portion between the extension portion 114 and the flat portion 115.

Each of the cross sections of the extension portion 114 and the flat portion 115 preferably has a width of about 20 mm and a thickness of about 1.5 mm, for example. Spacing between the extension portion 114 and the flat portion 115 in the Z-axis direction preferably is about 7 mm, for example. The value of a current flowing through each of the extension portion 114 and the flat portion 115 preferably is about 400 A, for example.

The position of a magnetic sensor is represented by a distance from an intersection point O of a center line L between the extension portion 114 and the flat portion 115 in the thickness direction (Z-axis direction) of the primary conductor 210 and a center line C between the extension portion 114 and the flat portion 115 in the width direction (X-axis direction) of the primary conductor 210. The position of a magnetic sensor in the X-axis direction is represented by a positive value on the side of the flat portion 115 and a negative value on the side of the extension portion 114.

As illustrated in FIG. 10, the distribution of magnetic flux densities in the X-axis direction is symmetric with respect to a point at 0 mm that is the position of a magnetic sensor. In a case where the gap G is about −4 mm or about −2 mm, for example, the magnetic flux density in the X-axis direction detected by the magnetic sensor is lower as compared to a case where the gap G is greater than or equal to 0 mm because a magnetic field generated around the extension portion 114 and a magnetic field generated around the flat portion 115 cancel each other.

The larger the gap G, the higher the magnetic flux density in the X-axis direction detected by the magnetic sensor because of the decline in the interaction between a magnetic field generated around the extension portion 114 and a magnetic field generated around the flat portion 115.

It was discovered from the results of the above-described simulation analysis that the sensitivity of a current sensor to a current to be measured flowing through the primary conductor 210 could be increased when the gap G between the extension portion 114 and the flat portion 115 in the X-axis direction was increased by the slit 216.

As compared with the current sensor 100 according to the first preferred embodiment, the current sensor 200 according to this preferred embodiment is able to have higher sensitivity to a current to be measured flowing through the primary conductor 210.

Third Preferred Embodiment

A current sensor according to the third preferred embodiment of the present invention will be described. A current sensor 300 according to the third preferred embodiment differs from the current sensor 200 according to the second preferred embodiment only in that a reverse arch portion is provided in a primary conductor, instead of a flat portion. Since the remaining configuration of the current sensor 300 is the same or substantially the same as that of the current sensor 200, the same reference numerals are used to denote the same portions and the description thereof will be omitted.

Figure 11:
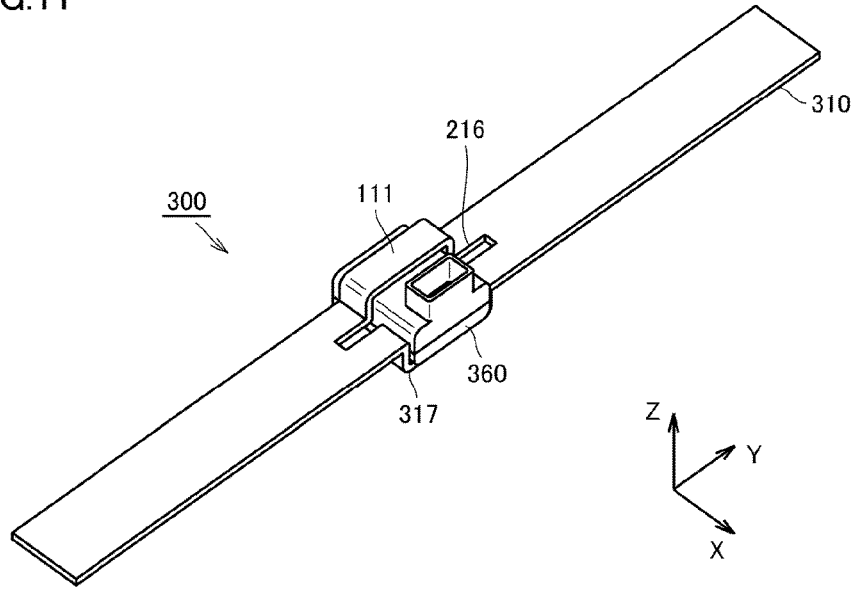
FIG. 11 is an external perspective view of a current sensor according to a third preferred embodiment of the present invention.
Figure 12:
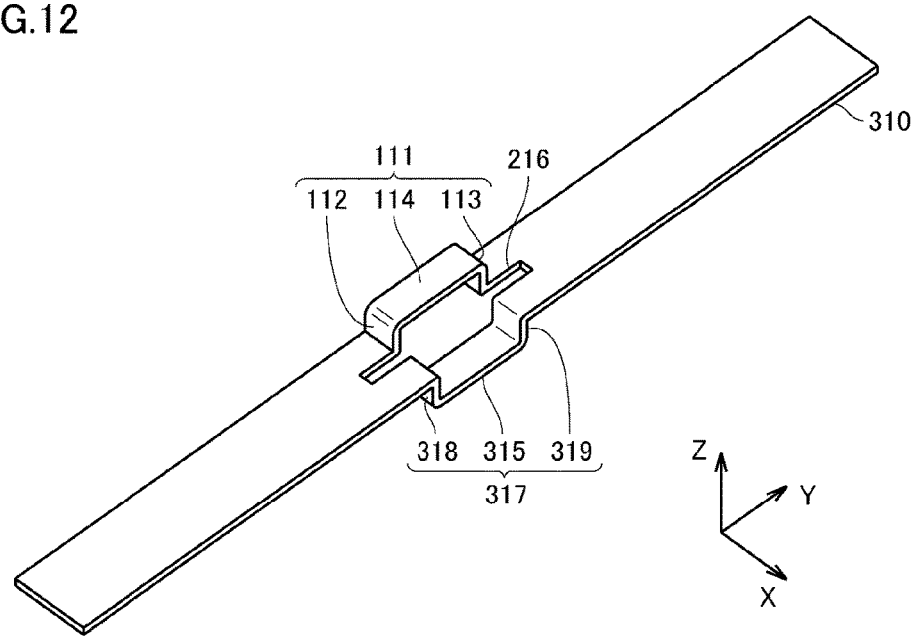
FIG. 12 is an external perspective view of a primary conductor included in a current sensor according to the third preferred embodiment of the present invention.
Figure 13:
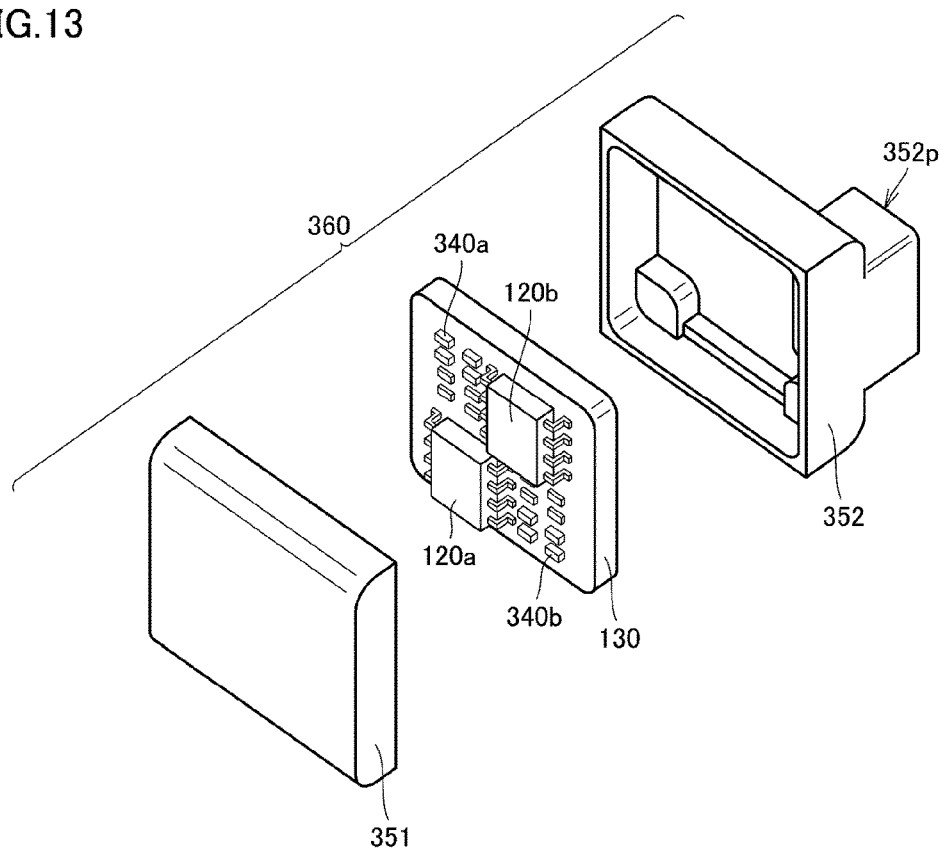
FIG. 13 is an exploded perspective view illustrating the configuration of a magnetic sensor unit included in a current sensor according to the third preferred embodiment of the present invention.
Figure 14:
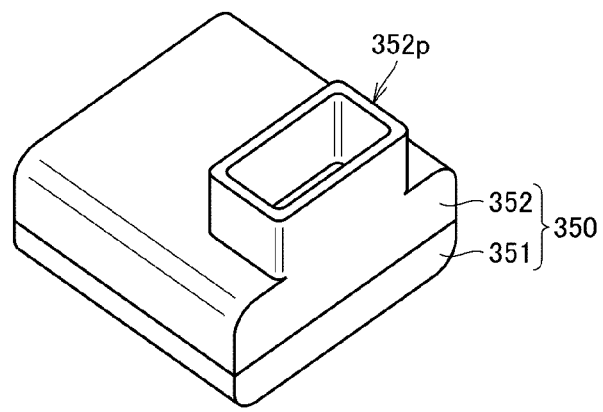
FIG. 14 is an external perspective view of a cabinet of a magnetic sensor unit included in a current sensor according to the third preferred embodiment of the present invention.

FIG. 11 is an external perspective view of a current sensor according to the third preferred embodiment of the present invention. FIG. 12 is an external perspective view of a primary conductor included in a current sensor according to the third preferred embodiment of the present invention. FIG. 13 is an exploded perspective view illustrating the configuration of a magnetic sensor unit included in a current sensor according to the third preferred embodiment of the present invention. FIG. 14 is an external perspective view of a cabinet of a magnetic sensor unit included in a current sensor according to the third preferred embodiment of the present invention.

As illustrated in FIGS. 11 to 14, the current sensor 300 according to the third preferred embodiment of the present invention includes a primary conductor 310 through which a current to be measured flows and the first and second magnetic sensors 120a and 120b that detect the intensity of a magnetic field generated by a current to be measured flowing through the primary conductor 310.

In the current sensor 300 according to this preferred embodiment, a reverse arch portion 317 is provided in the primary conductor 310. The reverse arch portion 317 extends in the length direction (Y-axis direction) of the primary conductor 310 while bending to project in the other thickness direction (Z-axis direction) of the primary conductor 310 which is across the slit 216 from the arch portion 111, and defines the other flow channel. The reverse arch portion 317 and the arch portion 111 are arranged in the width direction (X-axis direction) of the primary conductor 310. The slit 216 is located at the center or approximate center of the primary conductor 310 in the width direction (X-axis direction) of the primary conductor 310. The slit 216 is sandwiched between the arch portion 111 and the reverse arch portion 317.

As illustrated in FIG. 12, in this preferred embodiment, the reverse arch portion 317 preferably includes a third protrusion portion 318 and a fourth protrusion portion 319 that protrude perpendicularly or substantially perpendicularly from the main surface of the primary conductor 310 and are spaced apart from each other and an extension portion 315 that extends in the length direction (Y-axis direction) of the primary conductor 310 and connects the third protrusion portion 318 and the fourth protrusion portion 319. The reverse arch portion 317 does not necessarily need to have this shape and may have, for example, a C shape or a semicircular shape as viewed from the width direction (X-axis direction) of the primary conductor 310. The arch portion 111 and the reverse arch portion 317 preferably have the same or substantially the same shape.

As illustrated in FIG. 13, the first magnetic sensor 120a and the second magnetic sensor 120b are mounted on the substrate 130 along with electronic components 340a and 340b that are, for example, an amplifier and a passive element. In this preferred embodiment, the first magnetic sensor 120a and the second magnetic sensor 120b are arranged in the width direction (X-axis direction) of the primary conductor 310 while being offset from each other in the length direction (Y-axis direction) of the primary conductor 310. The substrate 130 is preferably fixed in an insulating cabinet 350, so that a magnetic sensor unit 360 is provided. That is, the first magnetic sensor 120a, the second magnetic sensor 120b, the electronic components 340a and 340b, and the substrate 130 are accommodated in the cabinet 350.

As illustrated in FIGS. 13 and 14, the cabinet 350 preferably has a parallelepiped or substantially parallelepiped outer shape and includes a lower cabinet 351 and an upper cabinet 352. In the upper cabinet 352, a wire harness outlet 352p to be connected to the substrate 130 is provided.

The cabinet 350 is preferably made of engineering plastic such as polyphenylene sulfide (PPS), for example. In a case where heat generated by the primary conductor 310 is taken into consideration, PPS having high heat resistance is a suitable material for the cabinet 350.

As a method of fixing the substrate 130 to the cabinet 350, screw fastening, thermal welding using a resin, or joining using an adhesive, for example, may preferably be used. In a case where the substrate 130 is fastened to the cabinet 350 using a screw, a non-magnetic screw is preferably used to prevent the disturbances of a magnetic field.

The magnetic sensor unit 360 is inserted into space provided by the arch portion 111 and the reverse arch portion 317. The first magnetic sensor 120a is, therefore, located on the inner side of the arch portion 111 and is disposed on the side of the undersurface of the extension portion 114. The second magnetic sensor 120b is located on the inner side of the reverse arch portion 317 and is disposed on the side of the surface of the extension portion 315.

In the above-described state, the cabinet 350 is preferably in contact with at least a portion of the inner surface of the arch portion 111. For example, the upper cabinet 352 is in contact with at least a portion of the undersurface of the extension portion 114. The cabinet 350 is preferably in contact with at least a portion of the inner surface of the reverse arch portion 317. For example, the lower cabinet 351 is in contact with at least a portion of the surface of the extension portion 315.

Lessening space between the first magnetic sensor 120a and the arch portion 111 and space between the second magnetic sensor 120b and the reverse arch portion 317 and reducing variations in the position of the first magnetic sensor 120a with respect to the arch portion 111 and variations in the position of the second magnetic sensor 120b with respect to the reverse arch portion 317 increases the sensitivity of the current sensor 300 and reduces variations in the measurement accuracy of the current sensor 300. As a result, the measurement reproducibility and mass productivity of the current sensor 300 is able to be increased. The arch portion 111 and the reverse arch portion 317 protect components in the magnetic sensor unit 360 from external forces.

The slit 216 is located between the first magnetic sensor 120a and the second magnetic sensor 120b in the width direction (X-axis direction) of the primary conductor 310 as viewed from the thickness direction (Z-axis direction) of the primary conductor 310.

In this preferred embodiment, since the second magnetic sensor 120b is located on the inner side of the reverse arch portion 317, a magnetic field surrounding the third protrusion portion 318, a magnetic field surrounding the fourth protrusion portion 319, and a magnetic field surrounding the extension portion 315 are applied to the second magnetic sensor 120b. Accordingly, the intensity of a magnetic field applied to a magnetoresistive element in the second magnetic sensor 120b is increased. This produces an increase in the sensitivity of the second magnetic sensor 120b to a current flowing through the primary conductor 310.

The current sensor 300 according to this preferred embodiment increases the sensitivity of each of the first magnetic sensor 120a and the second magnetic sensor 120b to a current to be measured flowing through the primary conductor 310, thus increasing the sensitivity of the current sensor 300 and reducing the influence of an external magnetic field.

In the current sensor 300 according to this preferred embodiment, since the electric resistance of the arch portion 111 and the electric resistance of the reverse arch portion 317 are the same or substantially the same, the amount of heat generated by the arch portion 111 and the amount of heat generated by the reverse arch portion 317 are the same or substantially the same when a current to be measured flows through the primary conductor 310. As a result, a temperature around a magnetoresistive element in the first magnetic sensor 120a and a temperature around a magnetoresistive element in the second magnetic sensor 120b are able to be the same or substantially the same. Measurement errors of the current sensor 300 arising from the temperature characteristics of magnetoresistive elements are therefore reduced.

Figure 15:
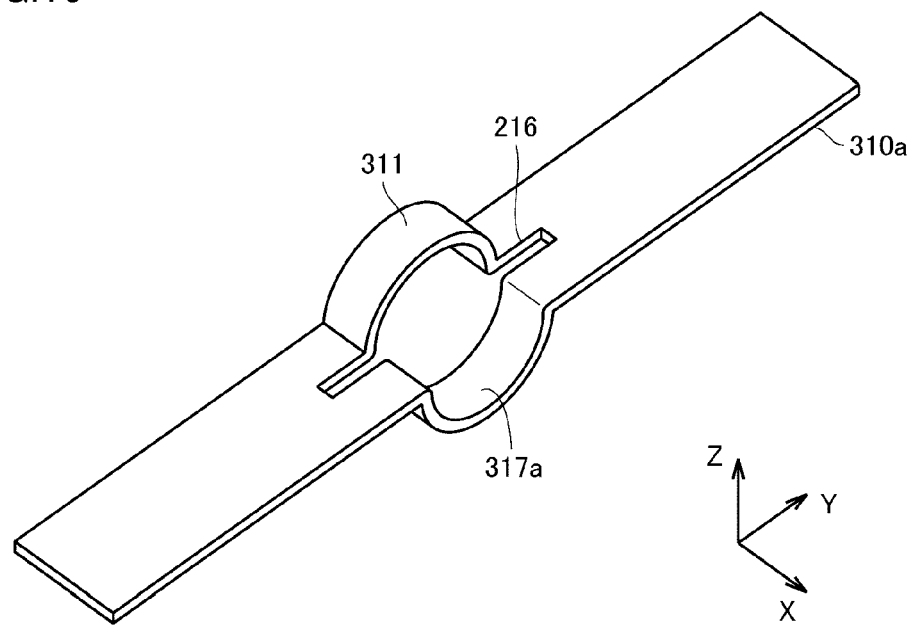
FIG. 15 is an external perspective view of a primary conductor included in a current sensor that is a modification of the third preferred embodiment of the present invention.

The arch portion 111 and the reverse arch portion 317 do not necessarily have the above-described shapes. FIG. 15 is an external perspective view of a primary conductor included in a current sensor that is a modification of the third preferred embodiment of the present invention. As illustrated in FIG. 15, a primary conductor 310a included in a current sensor, which is a modification of this preferred embodiment, includes the arch portion 111 and a reverse arch portion 317a, each of which preferably has a semicircular shape as viewed from the width direction (X-axis direction) of the primary conductor 310a. In a current sensor that is a modification of this preferred embodiment, a cabinet of a magnetic sensor unit preferably has a substantially cylindrical outer shape.

In the descriptions of the above preferred embodiments, structural configurations therefrom may be combined with each other. For example, in the current sensor 100 according to the first preferred embodiment, the reverse arch portion 317 may be provided in the primary conductor 110, instead of the flat portion 115. In the arch portion 111 in the current sensor 100 according to the first preferred embodiment and the current sensor 200 according to the second preferred embodiment, the magnetic sensor unit 360 may be inserted. In this case, the cabinet 350 is in contact with at least a portion of the inner surface of the arch portion 111. For example, the upper cabinet 352 is in contact with at least a portion of the undersurface of the extension portion 114. The lower cabinet 351 is in contact with at least a portion of the surface of the flat portion 115. In a current sensor, a cabinet may be integral with a primary conductor or may be removable from a primary conductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor comprising:
   a primary conductor through which a current to be measured flows; and
   a first magnetic sensor and a second magnetic sensor that each detects an intensity of a magnetic field generated by the current flowing through the primary conductor; wherein
   the current is diverted into first and second flow channels and flows through the primary conductor in a length direction of the primary conductor;
   the primary conductor includes an arch portion that extends in the length direction and bends to project in a first thickness direction of the primary conductor, and defines the first flow channel;
   the first magnetic sensor and the second magnetic sensor are arranged in a width direction of the primary conductor;
   the first magnetic sensor is disposed on an inner side of the arch portion and is located on a side of an undersurface of the primary conductor;
   the second magnetic sensor is located on a side of a surface of a portion of the primary conductor which defines the second flow channel; and
   each of the first magnetic sensor and the second magnetic sensor detects a magnetic field in the width direction.

2. The current sensor according to claim 1, further comprising:
   a calculator that calculates a value of the current by performing computations with a detection value of the first magnetic sensor and a detection value of the second magnetic sensor; wherein
   a detection value of the first magnetic sensor and a detection value of the second magnetic sensor are opposite in phase; and the calculator includes a subtractor or a differential amplifier.

3. The current sensor according to claim 1, further comprising:
a calculator that calculates a value of the current by performing computations with a detection value of the first magnetic sensor and a detection value of the second magnetic sensor; wherein
a detection value of the first magnetic sensor and a detection value of the second magnetic sensor are in phase; and
the calculator includes an adder or a summing amplifier.

4. The current sensor according to claim 1, wherein
the primary conductor further includes a reverse arch portion that extends in the length direction while bending to project in a second thickness direction opposite to the first thickness direction, and defines the second flow channel;
the reverse arch portion and the arch portion are arranged in the width direction; and
the second magnetic sensor is disposed on an inner side of the reverse arch portion and is located on a side of the surface of the primary conductor.

5. The current sensor according to claim 4, wherein the arch portion and the reverse arch portion have a same or substantially a same shape.

6. The current sensor according to claim 4, further comprising:
a cabinet that accommodates the first magnetic sensor and the second magnetic sensor therein; wherein
the cabinet is in contact with at least a portion of an inner surface of the arch portion and at least a portion of an inner surface of the reverse arch portion.

7. The current sensor according to claim 6, wherein
each of the arch portion and the reverse arch portion includes an extension portion extending in the length direction; and
the cabinet is in contact with at least a portion of an undersurface of the extension portion of the arch portion and at least a portion of a surface of the extension portion of the reverse arch portion.

8. The current sensor according to claim 4, wherein
the arch portion includes a first protrusion portion and a second protrusion portion that protrude perpendicular or substantially perpendicular to a first main surface of the primary conductor and are spaced apart from each other, and an extension portion that extends in the length direction of the primary conductor and connects the first protrusion portion and the second protrusion portion to each other; and
the reverse arch portion includes a third protrusion portion and a fourth protrusion portion that protrude perpendicularly or substantially perpendicularly from a second main surface of the primary conductor and are spaced apart from each other, and an extension portion that extends in the length direction of the primary conductor and connects the third protrusion portion and the fourth protrusion portion to each other.

9. The current sensor according to claim 4, wherein each of arch portion and the reverse arch portion has a C shape or a semicircular shape.

10. The current sensor according to claim 1, wherein
a slit extending in the length direction is provided in the primary conductor; and
the slit is adjacent to the arch portion in the width direction and is located between the first magnetic sensor and the second magnetic sensor as viewed from the first thickness direction.

11. The current sensor according to claim 10, wherein the slit is located between the first magnetic sensor and the second magnetic sensor in the width direction as viewed from the first thickness direction.

12. The current sensor according to claim 11, wherein the slit is located at a center or an approximate center of the primary conductor in the width direction.

13. The current sensor according to claim 1, wherein the first magnetic sensor and the second magnetic sensor are mounted on a single substrate.

14. The current sensor according to claim 1, wherein
each of the first magnetic sensor and the second magnetic sensor has a detection axis in the width direction and a sensitivity change axis perpendicular or substantially perpendicular to the detection axis;
output sensitivity of each of the first magnetic sensor and the second magnetic sensor changes when a magnetic field in a direction along the sensitivity change axis is applied thereto; and
each of the first magnetic sensor and the second magnetic sensor is arranged such that the sensitivity change axis is along the length direction.

15. The current sensor according to claim 1, further comprising:
a cabinet that accommodates the first magnetic sensor and the second magnetic sensor therein; wherein
the cabinet is in contact with at least a portion of an inner surface of the arch portion.

16. The current sensor according to claim 15, wherein
the arch portion includes an extension portion extending in the length direction; and
the cabinet is in contact with at least a portion of an undersurface of the extension portion.

17. The current sensor according to claim 1, wherein the arch portion includes a first protrusion portion and a second protrusion portion that protrude perpendicular or substantially perpendicular from a main surface of the primary conductor and are spaced apart from each other, and an extension portion that extends in the length direction of the primary conductor and connects the first protrusion portion and the second protrusion portion to each other.

18. The current sensor according to claim 1, wherein the arch portion has a C shape or a semicircular shape when viewed in the width direction of the primary conductor.

* * * * *